United States Patent [19]
Dimyan et al.

[11] 4,360,899
[45] Nov. 23, 1982

[54] MAGNETIC DOMAIN RANDOM ACCESS MEMORY

[75] Inventors: Magid Y. Dimyan, Richardson; Carlos A. Castro, Garland, both of Tex.

[73] Assignee: Texas Instruments Incorporated, Dallas, Tex.

[21] Appl. No.: 121,854

[22] Filed: Feb. 15, 1980

[51] Int. Cl.³ .......................................... G11C 11/155
[52] U.S. Cl. ........................................ 365/171; 365/2
[58] Field of Search ................. 365/2, 19, 20, 21, 129, 365/171, 172

[56] References Cited
U.S. PATENT DOCUMENTS 3,831,154  8/1974  Epstein et al. .......................... 365/2

OTHER PUBLICATIONS

Bell System Technical Journal-Oct. 1967, pp. 1901-1925.

Primary Examiner—James W. Moffitt
Attorney, Agent, or Firm—Robert O. Groover, III; Melvin Sharp; James T. Comfort

[57] ABSTRACT

In a non-volatile random access memory, a selected one of a plurality of magnetic cells arranged in an array on a major surface of a substrate is inductively switched between opposite remanent, i.e. permanent, states upon the simultaneous application of electrical pulses to a pair of conductors intersecting adjacent the selected cell, each of the electrical pulses having an amplitude less than, but the sum thereof being at least equal to, the amplitude required to inductively switch the remanent state of the selected cell.

10 Claims, 4 Drawing Figures

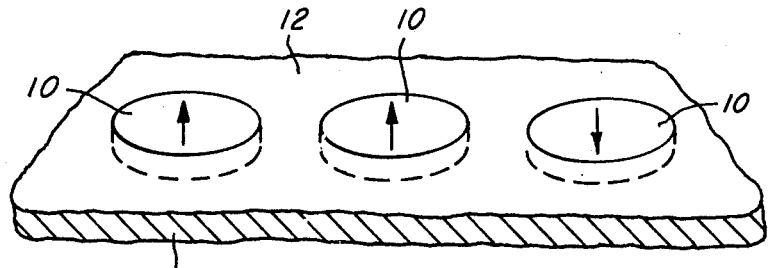
Fig. 1
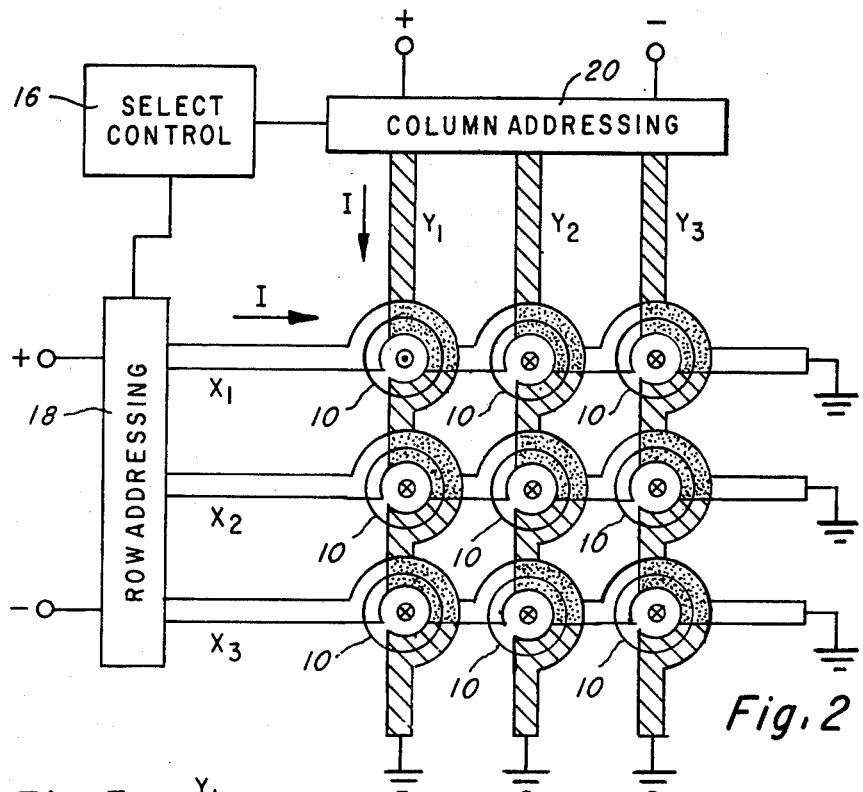
Fig. 2
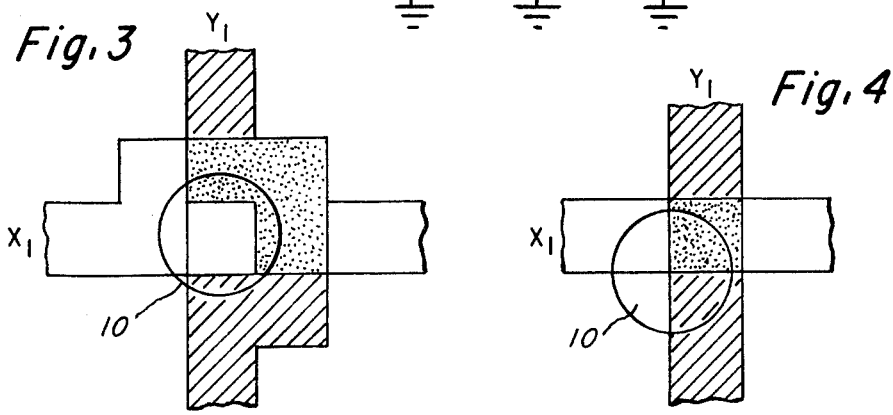
Fig. 3
Fig. 4

MAGNETIC DOMAIN RANDOM ACCESS MEMORY

CROSS-REFERENCE TO RELATED APPLICATIONS

Related subject matter is contained in the following U.S. Patent applications which have been filed simultaneously herewith and assigned to the Assignee of the present Application:

Ser. No. 122,550 filed Feb. 19, 1980 now U.S. Pat. No. 4,290,843, entitled "Epitaxial Growth of Magnetic Memory Film on Implanted Substrate," and, Ser. No. 122,325 filed Feb. 19, 1980 and now abandoned, entitled "Epitaxial Growth of Magnetic Memory Film in Substrate Recesses."

BACKGROUND OF THE INVENTION

1. Field of the Invention

The present invention relates generally to a random access memory and, more particularly, but not by way of limitation, to a non-volatile random access memory wherein individual magnetic cells are selectively switched between opposite remanent states.

2. Prior Art Statement

Magnetic materials of various types have been used for many years to form individual, bistable storage elements in memory applications and the like. In general, the individual elements may be either logically or physically distinguishable. In the former category, a substantially homogenous magnetic material is logically partitioned into a plurality of individual storage sites which are mechanically or electrically addressable. Typical of such devices are conventional magnetic disks or tape systems, as well as modern magnetic bubble devices. In the latter category, isolated bodies of magnetic material are physically arranged to facilitate controlled switching and detection of the remanent or permanent state thereof. Typical of such devices are magnetic core, plated wire and magnetic film memories (See, e.g. Chapter 23 of *Physics of Magnetism*, S. Chikazumi, John Whiley & Sons, Inc., 1966). More recently, magneto-optic memory systems have been developed which use thermomagnetic techniques to switch the remanent state of isolated islands of magnetic film (See, "Magneto-Optic Memory Materials" in *Optica Acta*, 1977, Vol. 24, Pp. 482-494). Such magneto-optic memory systems have also found use in display applications (See, "Fast Switchable Magneto-Optic Memory-Display Components" by Hill and Schmidt, *Philips Journal of Research*, 1978, Vol. 33, No.s 5-6, Pp. 211-225; and "Thin-Film Iron Garnet Display Components" by Hill and Schmidt in the *Digest of Technical Papers* presented at the 1979 SID International Symposium, First Edition, Pp. 80-81).

SUMMARY OF THE INVENTION

In the non-volatile random access memory of the present invention, an array of magnetic cells are formed on a major surface of a supporting substrate, each cell possessing a uniaxial magnetic anisotropy perpendicular to the substrate and being inductively switchable between opposite remanent states. First and second conductors are disposed adjacent to each of the cells in respective first and second subsets of the cells in the array, the intersection of the first and second subsets being a selected cell. Means are provided for simultaneously applying a pulse of electrical current to the first and second conductors, each of the pulses having an amplitude less than, but the sum thereof being at least equal to, the amplitude required to inductively switch the remanent state of the selected cell. Means may also be provided, if desired, to detect the remanent state of the selected cell.

BRIEF DESCRIPTION OF THE DRAWINGS

FIG. 1 is a partial perspective view of several magnetic cells employed in the present invention, schematically illustrating the opposite remanent states thereof.

FIG. 2 is a top plan view of a small array of the memory cells of FIG. 1 shown in conjunction with first and second sets of conductors arranged to select any particular one of the cells.

FIG. 3 is a partial, top plan view of an alternate form of the first and second conductors.

FIG. 4 is a partial, top plan view of one other alternate form of the first and second conductors.

DESCRIPTION OF THE PREFERRED EMBODIMENT

Shown in FIG. 1 are several memory cells 10 formed on a major surface 12 of a substrate 14. Each of the cells 10 possesses a uniaxial magnetic anisotropy perpendicular to the substrate, the two opposite remanent states being indicated schematically by conventional polarization symbols. In addition to the various methods for fabricating the cells 10 on the substrate 14 described in the references set forth above, the fabricating techniques set forth in the copending patent applications entitled "Epitaxial Growth of Magnetic Memory Film on Implanted Substrate" Ser. No. 122,550 filed Feb. 19, 1980 and "Epitaxial Growth of Magnetic Memory Film in Substrate Recesses" Ser. No. 122,325 filed Feb. 19, 1980 have produced planar memory film structures particularly advantageous for use in the present invention.

In FIG. 2, a number of the memory cells 10 are arranged on the surface 12 of the substrate 14 in an array of row subsets and column subsets. An X conductor is provided adjacent to, and preferably partially overlying, each of the cells 10 in a respective one of the rows of the array. Similarly, a Y conductor is provided adjacent to, and preferably partially overlying, each of the cells 10 in a respective one of the columns of the array. Of course, other arrangements of the X and Y conductors can be provided to suit a given array of the cells 10, providing that the subset of the cells 10 adjacent to each X conductor has one and only one cell 10 in common with the subset of the cells 10 adjacent to each of the Y conductors.

As will be clear to those skilled in the art, the application of a pulse of electrical current to any one of the X or Y conductors establishes a magnetic field surrounding that conductor according to Biot's law. If the current pulse is sufficiently great in amplitude, the resulting magnetic field in the region occupied by an adjacent cell 10 will be sufficiently strong to induce alignment of the magnetization of the cell 10, so that upon termination of the electrical current pulses, the cell 10 will exhibit a remanent state of similar orientation. Thus, the remanent state of a cell 10 can be selectively switched by the application of electrical current pulses of appropriate polarity and amplitude to an adjacent conductor. On the other hand, if the amplitude of the current pulse applied to any one of the X or Y conductors is sufficient to affect the remanent state of one of the adjacent cells 10, it will also be sufficient to affect the remanent state of all of the adjacent cells 10. The present invention avoids the latter, undesirable result, by simultaneously applying pulses of electrical current to both the X and Y conductors which intersect adjacent to a selected cell, with each of the pulses having an amplitude which is less than the amplitude required to inductively switch the remanent state of one of the cells 10. However, by making the sum of the electrical pulses at least equal to the switching amplitude, the resultant magnetic fields will be sufficient to affect the magnetic state of only that cell 10 which is adjacent to the intersection of the particular X and Y conductors.

In accordance with the preferred embodiment of the present invention, a select control 16 of conventional form simultaneously actuates conventional row and column addressing circuitry 18 and 20, respectively, to enable current flow of appropriate polarity in a particular one of the X and the Y conductors. In the illustrated example, current pulses I are applied in the indicated direction in the $X_1$ and $Y_1$ conductors, to effect selection of the cell 10 in the first row of the first column of the array. Assuming that prior to the applied pulses the polarity of the remanent state of the selected cell 10 was down, as in the other illustrated cells 10, the resultant polarity of the remanent state of the selected cell 10 will be up, as indicated. If the polarity of the applied current pulses I had been in the opposite direction, the polarity of the remanent state of the selected cell 10 would have been unaffected by the applied pulses. Using a 14 um diameter cell 10 of the magnetic garnet $(YSmLuCa)_3(GeFe)_5O_{12}$ formed in 3 um recesses in a gadolinium gallium garnet $(Gd_3Ga_5O_{12})$ substrate 14 in accordance with the method disclosed in the U.S. Patent Application Ser. No. 122,325 field Feb. 19, 1980 cited above, satisfactory selective switching has been obtained using 1.3 –1.6 uS current pulses I of the order of 90–110 mA at ambient room temperature.

Detection of the remanent state of any cell 10 can be accomplished using the magneto-optic or visual techniques discussed in the references cited above. Alternatively, the magnetic field sensor disclosed in U.S. Pat. No. 3,714,523 may be employed in a manner similar to that shown in U.S. Pat. No. 3,702,991. Other suitable techniques, such as Hall effect sensors and the like, will readily occur to those skilled in the art.

Although the X and Y conductors have been illustrated in FIG. 2 as being substantially semicircular adjacent to, and substantially conforming to the perimeter of, each of the associated cells 10, other configurations have been determined to be effective in inductively switching the remanent state of a selected one of the cells 10. For example, FIG. 3 illustrates an alternate embodiment wherein a rectilinear, U-shaped perturbation is formed in each of the X and Y conductors adjacent to, and preferably overlying a portion of, each of the associated cells 10. FIG. 4 illustrates one other alternate embodiment wherein the X and Y conductors are substantially straight adjacent to, but again preferably partially overlapping, the associated cells 10.

Although each of the cells 10 has been illustrated as being substantially circular in form, it has been determined that other geometries, such as square, may be fabricated and satisfactorily switched. Similarly, a non-overlying orientation of the X and Y conductors may be employed to enhance the magnetic flux through the adjacent cells 10, although at a somewhat reduced array density. Other changes may be made in the construction, arrangement or operation of the parts or elements of the preferred embodiment disclosed herein without departing from the spirit and scope of the present invention as defined in the following claims.

What is claimed is:

1. A non-volatile random access memory comprising:
   a substantially planar non-magnetic substrate;
   an array of ferri-magnetic cells formed in a major surface of the substrate, each cell possessing a uniaxial magnetic anisotropy perpendicular to the substrate and being inductively switchable between opposite remanent states;
   a row conductor overlying at least a portion of each of the cells in one of the rows in the array;
   a column conductor overlying at least a portion of each of the cells in one of the columns in the array, said row and column conductors all lying on the same side of said substrate;
   cell select means for simultaneously applying pulses of electrical current to each of the row and column conductors, said pulses being selected to inductively switch only the cell adjacent both the row and column conductors; and
   detect means for detecting the remanent state of the cell at the intersection of the row and column conductors.

2. The memory of claim 1 wherein the cell select means is further characterized as simultaneously applying pulses of electrical current to each of the row and column conductors, each of said pulses having an amplitude less than, but the sum thereof being at least equal to, the amplitude required to inductively switch one of the cells.

3. The memory of claim 1 wherein the cells are substantially circular in shape, and the row and column conductors are substantially semi-circular adjacent each of the cells.

4. The memory of claim 1 wherein the cell select means comprise:
   row addressing means for enabling current flow in the row conductor in response to the actuation thereof;
   column addressing means for enabling current flow in the column conductor in response to the actuation thereof; and
   select control means for simultaneously actuating the row and column addressing means.

5. The memory of claim 1 wherein the row and column conductors have rectilinear, U-shaped perturbations therein adjacent each of the cells.

6. A non-volatile random access memory comprising:
   a substantially planar non-magnetic substrate;
   an array of ferrimagnetic cells on a major surface of the substrate, each cell possessing a uniaxial magnetic anisotropy perpendicular to the substrate and being inductively switchable between opposite remanent states;
   a first conductor adjacent to each of the cells in a first subset of the cells in the array;
   a second conductor adjacent to each of the cells in a second subset of the cells in the array, the intersection of the first and second subsets being a selected cell; and
   cell select means for simultaneously applying pulses of electrical current to each of the first and second conductors, each of said pulses having an amplitude less than, but the sum thereof being at least equal to, the amplitude required to inductively switch the remanent state of the selected cell.

7. The memory of claim 6 further comprising:
detect means for detecting the remanent state of the selected cell.

8. The memory of claim 6 or 7 wherein the cells are substantially circular in shape, and the first and second conductors are substantially semi-circular adjacent each of the cells.

9. The memory of claim 6 or 7 wherein the cell select means comprise:

first addressing means for enabling current flow in the first conductor in response to the actuation thereof;
second addressing means for enabling current flow in the second conductor in response to the actuation thereof; and
select control means for simultaneously actuating the first and second addressing means.

10. The memory of claim 6 or 7 wherein the first and second conductors have rectilinear, U-shaped perturbations therein adjacent each of the cells.

* * * * *